United States Patent
Hsin et al.

(10) Patent No.: US 10,269,886 B2
(45) Date of Patent: Apr. 23, 2019

(54) ORGANIC ELECTROLUMINESCENT DISPLAY DEVICE AND MANUFACTURING METHOD THEREOF

(71) Applicant: BOE Technology Group Co., Ltd., Beijing (CN)

(72) Inventors: Lung Pao Hsin, Beijing (CN); Kelvin Chiang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 99 days.

(21) Appl. No.: 15/504,474

(22) PCT Filed: Jul. 13, 2016

(86) PCT No.: PCT/CN2016/089906
§ 371 (c)(1),
(2) Date: Feb. 16, 2017

(87) PCT Pub. No.: WO2017/113743
PCT Pub. Date: Jul. 6, 2017

(65) Prior Publication Data
US 2018/0226463 A1    Aug. 9, 2018

(30) Foreign Application Priority Data
Dec. 31, 2015    (CN) .......................... 2015 1 1032464

(51) Int. Cl.
*H01L 27/32* (2006.01)
*H01L 51/50* (2006.01)
(Continued)

(52) U.S. Cl.
CPC .......... *H01L 27/3262* (2013.01); *H01L 27/32* (2013.01); *H01L 27/3206* (2013.01);
(Continued)

(58) Field of Classification Search
CPC . H01L 27/32; H01L 27/3262; H01L 27/3206; H01L 27/3246; H01L 27/3265; H01L 51/5218; H01L 51/5231
See application file for complete search history.

(56) References Cited

U.S. PATENT DOCUMENTS 7,903,209 B2    3/2011  You
9,954,111 B2 *  4/2018  Yamazaki ........... H01L 29/7869
(Continued)

FOREIGN PATENT DOCUMENTS

CN    101154677 A    4/2008
CN    102087829 A    6/2011
(Continued)

OTHER PUBLICATIONS

Oct. 21, 2016—(WO) International Search Report and Written Opinion Appn PCT/CN2016/089906 with English Tran.
(Continued)

*Primary Examiner* — Phuc T Dang
(74) *Attorney, Agent, or Firm* — Banner & Witcoff, Ltd.

(57) ABSTRACT

An organic electroluminescent display device and a manufacturing method thereof are disclosed. The organic electroluminescent display device includes a substrate, a first thin film transistor disposed on the substrate, a second thin film transistor disposed on the first thin film transistor, a first light emitting element electrically connected with a drain of the first thin film transistor, wherein the first light emitting element comprises a first electrode, a first light emitting layer and a second electrode which are stacked, a second light emitting element electrically connected with a drain of the second thin film transistor, wherein the second light emitting element is disposed on the second thin film transistor and comprises a third electrode, a second light emitting layer and a fourth electrode, wherein the second light emitting element is configured to emit white light. By (Continued)

forming the second light emitting element on the second thin film transistor, an original non-display region of the organic electroluminescent display device becomes a display region, as a result, an aperture ratio of the organic electroluminescent display device is increased, and the display effect of the organic electroluminescent display device is improved.

18 Claims, 3 Drawing Sheets

(51) Int. Cl.
    *H01L 51/52*     (2006.01)
    *H01L 27/12*     (2006.01)

(52) U.S. Cl.
    CPC ...... *H01L 27/3246* (2013.01); *H01L 27/3265* (2013.01); *H01L 51/50* (2013.01); *H01L 51/5218* (2013.01); *H01L 51/5231* (2013.01); *H01L 51/5265* (2013.01); *H01L 27/1214* (2013.01); *H01L 27/322* (2013.01); *H01L 2227/323* (2013.01)

(56) References Cited

U.S. PATENT DOCUMENTS

| | | | |
|---|---|---|---|
| 2010/0026611 | A1 | 2/2010 | Igeta et al. |
| 2013/0009194 | A1* | 1/2013 | Yamazaki ............ H01L 51/524 257/99 |
| 2016/0133674 | A1* | 5/2016 | Lee ..................... H01L 51/5012 257/40 |

FOREIGN PATENT DOCUMENTS

| | | |
|---|---|---|
| CN | 103022079 A | 4/2013 |
| CN | 103107182 A | 5/2013 |
| CN | 103928488 A | 7/2014 |
| CN | 104716167 A | 6/2015 |
| CN | 105428392 A | 3/2016 |

OTHER PUBLICATIONS

Oct. 26, 2016—(CN) Second Office Action Appn 201511032464.1 with English Tran.

* cited by examiner

ORGANIC ELECTROLUMINESCENT DISPLAY DEVICE AND MANUFACTURING METHOD THEREOF

CROSS REFERENCE TO RELATED APPLICATION

The application is a U.S. National Phase Entry of International Application No. PCT/CN2016/089906 filed on Jul. 13, 2016, designating the United States of America and claiming priority to Chinese Patent Application No. 201511032464.1, filed on Dec. 31, 2015. The present application claims priority to and the benefit of the above-identified applications and the above-identified applications are incorporated by reference herein in their entirety.

TECHNICAL FIELD

Embodiments of the disclosure relate to an organic electroluminescent display device and a method for manufacturing the same.

BACKGROUND

An active matrix organic light emitting display (AMOLED) has a same characteristic of being driven by current as an organic light emitting diode (OLED). For an active matrix organic light emitting display (AMOLED), a plurality of thin film transistors (TFTs) and a plurality of capacitors are typically disposed in the design of pixels (Pixel), but such a structure would decrease the aperture ratio. With the development of the display technology, the requirement on the aperture ratio becomes higher. At present, the design of the top emission pixels is gradually appeared in high-end products, the fabrication of display panel including top emission pixels has also become a major challenge in the development of display technology.

In order to reduce the risk of short circuit of the OLED, the metal climbing structure, which is filled with a pixel-defined layer and around the via hole, is used commonly in mass production process, but it would bring a problem of low aperture ratio.

SUMMARY

Embodiments of the disclosure disclose an organic electroluminescent display device and a manufacturing method thereof. In the organic electroluminescent display device, a second thin film transistor is formed on the first thin film transistor, and a second light emitting element being capable of emitting white light is disposed on the second thin film transistor, such that an original non-display region of the organic electroluminescent display device becomes a display region, as a result, an aperture ratio of the organic electroluminescent display device is increased, and the display effect of the organic electroluminescent display device is improved.

At least one of embodiments of the disclosure discloses an organic electroluminescent display device, which comprises a substrate, a first thin film transistor disposed on the substrate, a second thin film transistor disposed on the first thin film transistor, a first light emitting element electrically connected with a drain of the first thin film transistor, wherein the first light emitting element comprises a first electrode, a first light emitting layer and a second electrode which are stacked, a second light emitting element electrically connected with a drain of the second thin film transistor, wherein the second light emitting element is disposed on the second thin film transistor and comprises a third electrode, a second light emitting layer and a fourth electrode, wherein the second light emitting element is configured to emit white light.

In the organic electroluminescent display device provided in one of embodiments of the disclosure, one of the first electrode and the second electrode is a reflective layer, and the other is a transflective layer, so as to form a micro-cavity structure.

In the organic electroluminescent display device provided in one of embodiments of the disclosure, the first electrode is disposed in a same layer as a gate of the second thin film transistor, and the second electrode is disposed in a same layer as an active layer of the second thin film transistor.

In the organic electroluminescent display device provided in one of embodiments of the disclosure, the micro-cavity structure further comprises a fifth electrode disposed between the first electrode and the second electrode, the fifth electrode is disposed in a same layer as the third electrode.

In the organic electroluminescent display device provided in one of embodiments of the disclosure, the first light emitting element comprises a red light emitting element, a green light emitting element, and a blue light emitting element; the organic electroluminescent display device further comprises a light emitting unit, which comprises a red light emitting unit corresponding to the red light emitting element, a green light emitting unit corresponding to the green light emitting element, a blue light emitting unit corresponding to the blue light emitting element, and a white light emitting unit corresponding to the second light emitting element.

In the organic electroluminescent display device provided in one of embodiments of the disclosure, the first light emitting element is a white light emitting element; the organic electroluminescent display device further comprises a light emitting unit, which comprises a red light emitting unit comprising a first light emitting element and a red color film, a green light emitting unit comprising a first light emitting element and a green color film, a blue light emitting unit comprising a first light emitting element and a blue color film, and a white light emitting unit corresponding to the second light emitting element.

The organic electroluminescent display device provided in one of embodiments of the disclosure further comprises: a first passivation layer disposed between the first thin film transistor and the second thin film transistor, a first via hole disposed in the first passivation layer, wherein the first via hole is covered by a projection of the second light emitting element which is orthographically projected onto the first passivation layer.

The organic electroluminescent display device provided in one of embodiments of the disclosure further comprises: a second passivation layer disposed on the second thin film transistor, a second via hole disposed in the second passivation layer, wherein the third electrode is connected with the drain of the second thin film transistor through the second via hole.

In the organic electroluminescent display device provided in one of embodiments of the disclosure, the second via hole is covered by a projection of the second light emitting element which is orthographically projected onto the second passivation layer.

The organic electroluminescent display device provided in one of embodiments of the disclosure further comprises: a capacitor disposed on the substrate, wherein the capacitor is covered by a projection of the second light emitting element which is orthographically projected onto a plane in which the capacitor is located.

In the organic electroluminescent display device provided in one of embodiments of the disclosure, a light emitting direction of the first light emitting element and a light emitting direction of the second light emitting element are same as each other.

At least one of embodiments of the disclosure further discloses a method for manufacturing an organic electroluminescent display device, comprising: providing a substrate; forming a first thin film transistor on the substrate; forming a second thin film transistor on the first thin film transistor; forming a first light emitting element electrically connected with a drain of the first thin film transistor, wherein the first light emitting element comprises a first electrode, a first light emitting layer and a second electrode which are stacked; forming a second light emitting element electrically connected with a drain of the second thin film transistor, wherein the second light emitting element is disposed on the second thin film transistor and comprises a third electrode, a second light emitting layer and a fourth electrode; wherein the second light emitting element is configured to emit white light.

In the method for manufacturing the organic electroluminescent display device provided in one of embodiments of the disclosure, one of the first electrode and the second electrode is a reflective layer, and the other is a transflective layer, so as to form a micro-cavity structure.

In the method for manufacturing the organic electroluminescent display device provided in one of embodiments of the disclosure, the micro-cavity structure further comprises a fifth electrode, the fifth electrode and the third electrode are formed by a single patterning process.

In the method for manufacturing the organic electroluminescent display device provided in one of embodiments of the disclosure, the first electrode and a gate of the second thin film transistor are formed by a single patterning process; the second electrode and an active layer of the second thin film transistor are formed by a single patterning process.

The method for manufacturing the organic electroluminescent display device provided in one of embodiments of the disclosure, further comprises: forming a first passivation layer between the first thin film transistor and the second thin film transistor, forming a first via hole in the first passivation layer, wherein the first via hole is covered by a projection of the second light emitting element which is orthographically projected onto the first passivation layer.

The method for manufacturing the organic electroluminescent display device provided in one of embodiments of the disclosure, further comprises: forming a second passivation layer on the second thin film transistor, forming a second via hole in the second passivation layer, wherein the third electrode is connected with the drain of the second thin film transistor through the second via hole.

In the method for manufacturing the organic electroluminescent display device provided in one of embodiments of the disclosure, the second via hole is covered by a projection of the second light emitting element which is orthographically projected onto the second passivation layer.

The method for manufacturing the organic electroluminescent display device provided in one of embodiments of the disclosure, further comprises: forming a capacitor, wherein one electrode plate of the capacitor is disposed in a same layer as the gate or a source of the first thin film transistor, the other electrode plate of the capacitor is disposed in a same layer as the gate of the second thin film transistor, wherein the capacitor is covered by a projection of the second light emitting element which is projected onto a plane in which the capacitor is located.

In the method for manufacturing the organic electroluminescent display device provided in one of embodiments of the disclosure, a light emitting direction of the first light emitting element and a light emitting direction of the second light emitting element are same as each other.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

REFERENCE SIGNS

10—substrate; 20—first thin film transistor; 30—second thin film transistor; 40—first light emitting element; 50—second light emitting element; 60—capacitor; 21—drain of the first thin film transistor; 22—insulation layer; 23—first passivation layer; 24—first via hole; 25—source of the first thin film transistor; 26—gate of the first thin film transistor; 27—gate insulation layer of the first thin film transistor; 28—active layer of the first thin film transistor; 31—gate of the second thin film transistor; 32—active layer of the second thin film transistor; 33—source of the second thin film transistor; 34—drain of the second thin film transistor; 36—pixel-defined layer; 37—second passivation layer; 38—second via hole; 41—first electrode; 42—first light emitting layer; 43—second electrode; 44—fifth electrode; 51—third electrode; 52—second light emitting layer; 5—fourth electrode; 61—first electrode plate; 62—second electrode plate.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Embodiment 1

The present embodiment of the disclosure provides an organic electroluminescent display device, which has a structure disposed on a thin film transistor and being capable of emitting white light, such that an original non-display region of the organic electroluminescent display device has a display function, as a result, an aperture ratio of the organic electroluminescent display device is increased, and the display effect of the organic electroluminescent display device is improved. In order to easily understand the technical solution of the disclosure, it will be described in detail with reference to the drawings and specific embodiments in the following.

Figure 1:
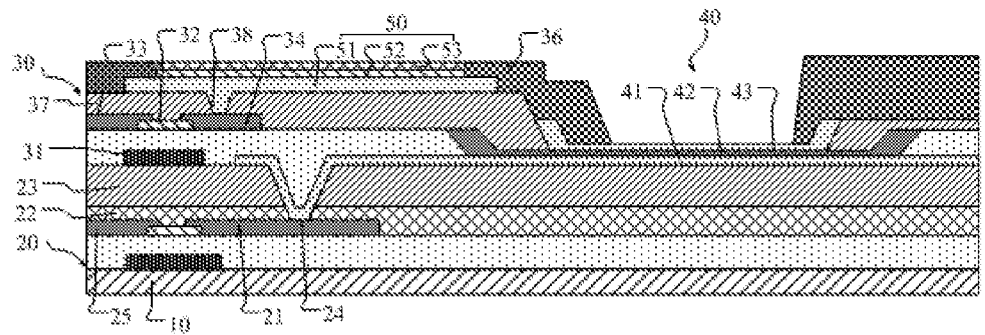
FIG. 1 schematically illustrates a cross-section view of an organic electroluminescent display device according to an embodiment of the disclosure.

FIG. 1 schematically illustrates a cross-section view of an organic electroluminescent display device according to an embodiment of the disclosure. The organic electroluminescent display device comprises a substrate 10, a first thin film transistor 20 disposed on the substrate 10, a second thin film transistor 30 disposed on the first thin film transistor 20, a first light emitting element 40 electrically connected with a drain 21 of the first thin film transistor and comprising a first electrode 41, a first light emitting layer 42 and a second electrode 43 which are stacked, a second light emitting element 50 electrically connected with a drain 34 of the second thin film transistor, the second light emitting element 50 is disposed on the second thin film transistor 30, and comprises a third electrode 51, a second light emitting layer 52 and a fourth electrode 53. Herein the second light emitting element 50 is configured to emit white light. Because the second light emitting element 50 emits white light, an original non-display region becomes a display region, as a result, the aperture ratio of the organic electroluminescent display device is increased, and the display effect of the organic electroluminescent display device is improved.

For example, in order to increase the light extraction efficiency and the brightness of the display device, one of the first electrode 41 and second electrode 43 is a reflective layer, and the other is a transflective layer, so as to form a micro-cavity structure, the light emitted by the first light emitting element is emitted from the electrode which is a transflective layer. For example, the first electrode 41 is a transflective layer and the second electrode 43 is a reflective layer, so that a micro-cavity structure is formed between the first electrode 41 and the second electrode 43 to make the purity of the emitted light higher. For example, either of the first electrode 41 and the second electrode 43 is a reflective electrode made of a reflective material and the other is a transflective electrode made of a transflective material.

For example, as illustrated in FIG. 1, the first electrode 41 is disposed in the same layer as a gate 31 of the second thin film transistor, and the second electrode 43 is disposed in the same layer as an active layer 32 of the second thin film transistor.

Figure 2:
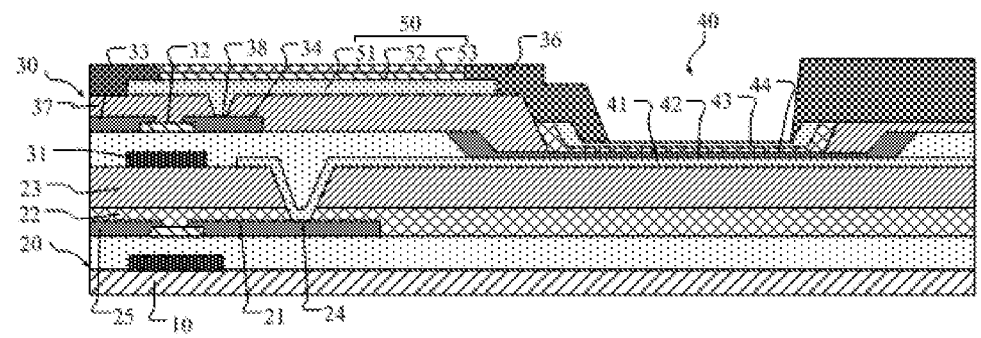
FIG. 2 schematically illustrates a cross-section view of another organic electroluminescent display device according to an embodiment of the disclosure.

For example, FIG. 2 schematically illustrates a cross-section view of another organic electroluminescent display device according to an embodiment of the disclosure. The micro-cavity structure further comprises a fifth electrode 44 disposed between the first electrode 41 and the second electrode 43, such that the thickness of the micro-cavity structure is changed. Micro-cavity structure refers to a structure that has a thickness of micron scale and is formed between a reflective layer and a transflective layer. The principle of enhancing the light intensity by the micro-cavity structure is that: the light is reflected continuously between the reflective layer and the transflective layer and is finally emitted from the transflective layer, so the intensity of the light at a specific wavelength is enhanced due to the resonance effect, and the wavelength of enhanced light is related to the thickness of the micro-cavity. Different light emitting units are used to emit different colors of light, and thus it is required that the thicknesses of the micro-cavities of the different light emitting units is different from one another, so that light of different wavelengths in different light emitting units can be enhanced.

For example, as illustrated in FIG. 2, the fifth electrode 44 is disposed in the same layer as the third electrode 51.

According to an embodiment of the disclosure, by forming the second thin film transistor 30 on the first thin film transistor 20 and forming the second light emitting element 50 capable of emitting white light on the second thin film transistor 30, an original non-display region of the organic electroluminescent display device becomes a display region, thus the aperture ratio of the organic electroluminescent display device is increased, and the display effect of the organic electroluminescent display device is improved.

In order to easily understand the structure of the organic electroluminescent display device provided by the embodiment of the disclosure, the embodiment will be described in detail with reference to FIG. 1 and FIG. 2.

In an organic electroluminescent display device, a display region and a non-display region of a display device are formed on a substrate, herein a first thin film transistor is disposed in the non-display region, and a pixel unit is disposed in the display region. The pixel unit comprises a plurality of sub-pixels, such as a red sub-pixel, a green sub-pixel and a blue sub-pixel.

According to an embodiment of the disclosure, in order to increase the aperture ratio of the organic electroluminescent display device, a second thin film transistor 30 is disposed on at least one first thin film transistor 20, and a second light emitting element 50 is formed on the second thin film transistor 30, the second light emitting element 50 is configured to emit white light, so the original non-display region becomes a display region. In addition, during the manufacturing process, the first light emitting element 40 is formed during the formation of the second thin film transistor 30. Herein, the first electrode 41 of the first light emitting element 40 is disposed in the same layer as the gate of the second thin film transistor 31; the second electrode 43 is disposed in the same layer as the active layer 32 of the second thin film transistor 30; the fifth electrode 44 is disposed in the same layer as the third electrode 51, so that the manufacturing process is simplified and the process steps are saved.

For example, the organic electroluminescent display device provided in the present embodiment comprises a plurality of sub-pixels, such as a red sub-pixel, a green sub-pixel, a white sub-pixel and a blue sub-pixel. Alternatively, the organic electroluminescent display device comprises a plurality of sub-pixels, such as a red sub-pixel, a white sub-pixel and a blue sub-pixel.

For example, when the above described red, blue, white, and green sub-pixels are in a mixed arrangement, the PPI (Pixels Per Inch) of pixel is increased by at least 1.5 times, so that the display effect of the organic electroluminescent display device provided in the present embodiment is better. It is noted that, PPI refers to the number of pixels per inch. For example, the light emitted from the red sub-pixel, the blue sub-pixel, and the green sub-pixel is emitted through a filter, while the above effect is achieved.

For example, the first light emitting element 40 of the organic electroluminescent display device provided in the present embodiment comprises a red light emitting element, a green light emitting element, and a blue light emitting element. The organic electroluminescent display device further comprises a light emitting unit, which comprises a red light emitting unit corresponding to the red light emitting element, a green light emitting unit corresponding to the green light emitting element, a blue light emitting unit corresponding to the blue light emitting element, and a white light emitting unit corresponding to the second light emitting element 50.

For example, the first light emitting element is a white light emitting element. The organic electroluminescent display device further comprises a light emitting unit, which comprises red, green, blue and white light emitting units. Herein, the red light emitting unit comprises the first light emitting element and a red color film, the green light emitting unit comprises the first light emitting element and a green color film, the blue light emitting unit comprises the first light emitting element and a blue color film, and the white light emitting unit corresponds to the second light emitting element.

For example, in order to adjust the thickness of the micro-cavity structure, the sum of the thicknesses of the second electrode 43 and the fifth electrode 44 of the first light emitting element 40 may be adjusted. For example, the sum of the thicknesses of the second electrode 43 and the fifth electrode 44 of the first light emitting element 40 may correspond to the blue light emitting unit only, so that the blue light emitted is higher in purity, or the sum may correspond to two or three colors of light emitting units respectively. While corresponding to the different light emitting units, the sum of thicknesses of the second electrode 43 and the fifth electrode 44 is various; alternatively, the organic electroluminescent display device is adjusted by incorporating additional electrode with a certain thickness into the first light emitting element 40 so as to emit light of different colors.

For example, the organic electroluminescent display device provided in the present embodiment further comprises a first passivation layer 23 disposed between the first thin film transistor 20 and the second thin film transistor 30. For example, an insulation layer 22 is further disposed between the first thin film transistor 20 and the second thin film transistor 30. A first via hole 24 is disposed in both the insulation layer 22 and the first passivation layer 23. The first via hole 24 is covered by a projection of the second light emitting element 50 which is orthographically projected onto the first passivation layer 23.

For example, the disposition of first via hole 24 may facilitate the interconnection of other parts, so that wirings of the display device may be connected with each other with an interlayer disposed therebetween. However, in this case, the region corresponding to the first via hole 24 will become a non-display region, and result in a decrease in the aperture ratio of the display device.

According to the present embodiment, in order to increase the aperture ratio of the display device, the first via hole 24 is covered by a projection of the first light emitting element 40 which is orthographically projected onto the first passivation layer 23, so as to avoid the affection of the first via hole 24 on the aperture ratio, then the region corresponding to the first via hole 24 becomes a display region.

The organic electroluminescent display device provided in the present embodiment further comprises a second passivation layer 37 disposed on the second thin film transistor 30, and a second via hole 38 is disposed in the second passivation layer 37, herein the third electrode 51 is connected with the drain 34 of the second thin film transistor 30 through the second via hole 38. The second passivation layer 37 is disposed to protect the second thin film transistor 30.

For example, the second via hole 38 is covered by a projection of the second light emitting element 50 which is orthographically projected onto the second passivation layer 37, so as to avoid the affection of the second via hole 38 on the aperture ratio, then the region corresponding to the second via hole 38 becomes a display region too.

For example, as illustrated in FIG. 2, the light emitting directions of the first light emitting element 40 and the second light emitting element 50 are same as each other. For example, when the light emitted from the first light emitting element 40 is emitted through the second electrode 43, the light emitted from the second light emitting element 50 is emitted through the fourth electrode 53, and both the second electrode 43 and the fourth electrode 53 are made of transparent materials.

Figure 3:
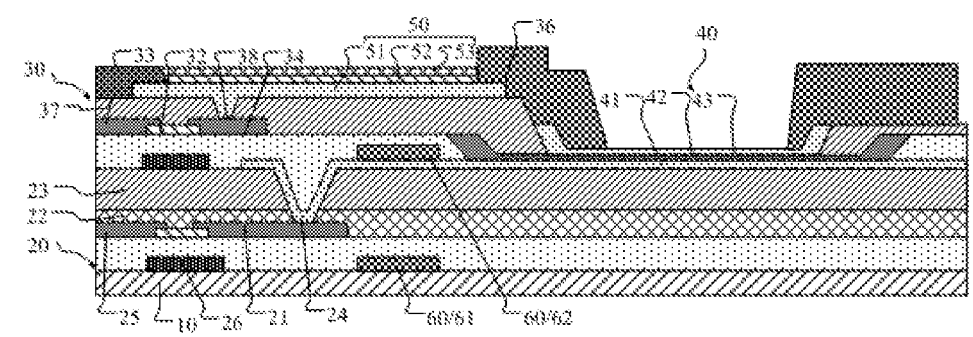
FIG. 3 schematically illustrates a cross-section view of still another organic electroluminescent display device according to an embodiment of the disclosure.

FIG. 3 schematically illustrates a cross-section view of still another organic electroluminescent display device according to an embodiment of the disclosure. The organic electroluminescent display device provided in the present embodiment further comprises a capacitor 60 disposed on the substrate 10, herein the capacitor 60 is covered by a projection of the second light emitting element which is orthographically projected onto the plane in which the capacitor 60 is located. When the display device of the present embodiment is applied to a display device, the charging and discharging of the pixel circuit is achieved by the metal layer, and then the storage of the capacitance is achieved. At present, a design with high PPI faces the problem of insufficient capacitance, however, if the capacitance is increased by enlarging the metal layer, the aperture ratio of the display device would be decreased.

For example, in the display device provided in the embodiment, the aperture ratio of the display device could not be affected by the capacitor. For example, as illustrated in FIG. 3, a first electrode plate 61 of the capacitor 60 is disposed in the same layer as the gate 26 of the first thin film transistor (or the source 25 of the first thin film transistor), and a second electrode plate 62 is disposed in the same layer as the gate 31 of the second thin film transistor which disposed on the first thin film transistor 20. Herein, the capacitor 60 is covered by the orthographical projection of the second light emitting element which is projected onto the plane in which the capacitor 60 is located. That is, the aperture ratio of the display device is not affected by the capacitor, because the capacitor is covered by the second light emitting element. For example, the capacitor 60 is covered by a projection of the second light emitting element which is orthographically projected onto the plane in which the capacitor 60 is located, so as to avoid the affection of the capacitor 60 on the aperture ratio of the display device.

For example, as illustrated in FIG. 3, the light emitting direction of the first light emitting element 40 and the second light emitting element 50 are same as each other. For example, when the light emitted from the first light emitting element 40 is emitted through the second electrode 43, the light emitted from the second light emitting element 50 is emitted through the fourth electrode 53, and both the second electrode 43 and the fourth electrode 53 are made of transparent materials.

Embodiment 2

The present embodiment of the disclosure provides a manufacturing method for the organic electroluminescent display device, which comprises: providing a substrate 10; forming a first thin film transistor 20 on the substrate 10; forming a second thin film transistor 30 on the first thin film transistor 20; forming a first light emitting element 40 electrically connected with a drain 21 of the first thin film transistor, herein the light emitting element 40 comprises a first electrode 41, a first light emitting layer 42 and a second electrode 43, which are stacked; forming a second light emitting element 50 electrically connected with a drain 34 of the second thin film transistor, the second light emitting element 50 is disposed on the second thin film transistor 30 and comprises a third electrode 51, a second light emitting layer 52 and a fourth electrode 53; herein the second light emitting element 50 is configured to emit white light.

For example, one of the first electrode 41 and second electrode 43 is a reflective layer, and the other is a transflective layer, so as to form a micro-cavity structure.

For example, the micro-cavity structure further comprises a fifth electrode 44, the fifth electrode 44 and the third electrode 51 are formed by a single patterning process.

For example, the first electrode 41 and the gate 31 of the second thin film transistor are formed by a single patterning process; the second electrode 43 and the active layer 32 of the second thin film transistor are formed by a single patterning process.

In the present embodiment, the second light emitting element 50 is disposed on the second thin film transistor 30 and comprises a third electrode 51, a second light emitting layer 52 and a fourth electrode 53. As a result, the aperture ratio of the organic electroluminescent display device is increased, and the display effect of the organic electroluminescent display device is improved.

In order to easily understand the method for manufacturing the organic electroluminescent display device provided by embodiments of the disclosure, the method will be described in detail with reference to FIG. 4a to FIG. 4e. The method comprises the following steps:

Step 1: providing a substrate 10;

Step 2: forming a first thin film transistor 20 on the substrate 10;

Step 3: forming a second thin film transistor 30 on the first thin film transistor 20, forming a first light emitting element 40 electrically connected with a drain 21 of the first thin film transistor, herein the light emitting element 40 comprises a first electrode 41, a first light emitting layer 42 and a second electrode 43 which are stacked;

Step 4: forming a second light emitting element 50 electrically connected with a drain 34 of the second thin film transistor, herein the second light emitting element 50 is disposed on the second thin film transistor 30 and comprises a third electrode 51, a second light emitting layer 52 and a fourth electrode 53; herein the second light emitting element 50 is configured to emit white light.

Step 5: forming a pixel-defined layer 36.

Figure 4A:
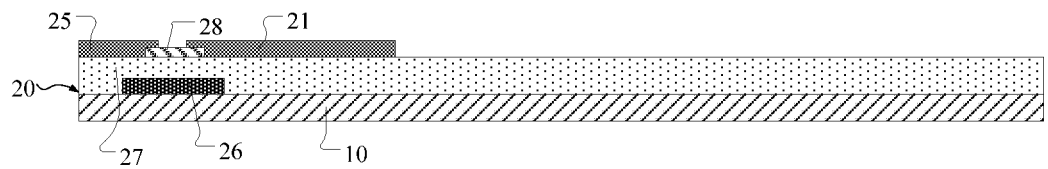
FIGS. 4a to 4e schematically illustrate flow diagrams of manufacturing method for an organic electroluminescent display device according to an embodiment of the disclosure.

As illustrated in FIG. 4a, the first thin film transistor 20 is formed by a conventional method, the processes of manufacturing the gate 26, the gate insulation layer 27, the active layer 28, the source 25, the drain 21 of the first thin film transistor and the like can be referred to the conventional manufacturing process, and will not be described here.

Figure 4B:
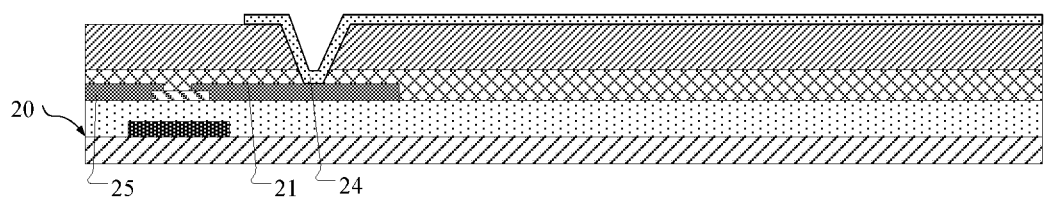

As illustrated in FIG. 4b, an insulation layer 22 and a first passivation layer 23 are formed on the first thin film transistor 20 by a conventional method, a first via hole 24 is formed in the insulation layer 22 and the first passivation layer 23.

Figure 4C:
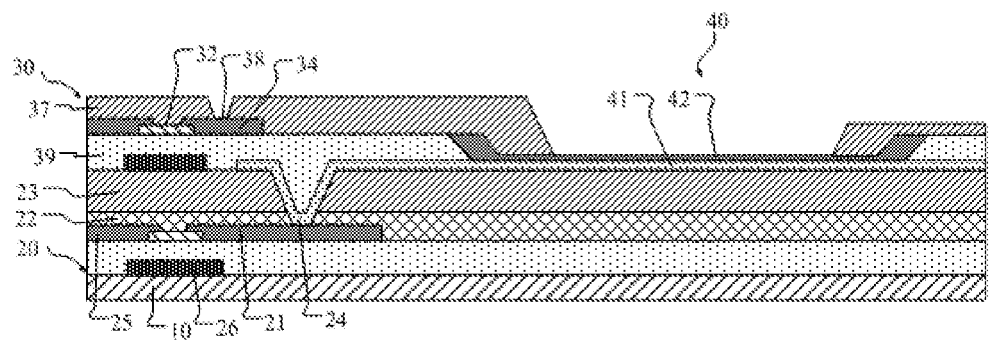

As illustrated in FIG. 4c, a second thin film transistor 30 is formed on the first passivation layer 23, a second passivation layer 37 is formed on the second thin film transistor 30, and a second via hole 38 is formed in the second passivation layer 37. Similarly, the processes of manufacturing the gate 31, the gate insulation layer 39, the active layer 32, the drain 34 of the second thin film transistor and the like can be referred to the conventional manufacturing process, and will not be described here. The first electrode 41 of the first light emitting element 40 is formed by a single patterning process, during the formation of the gate 31 of the second thin film transistor; and the second electrode 43 of the first light emitting element 40 is formed by a single patterning process, during the formation of the active layer 32 of the second thin film transistor.

Figure 4D:
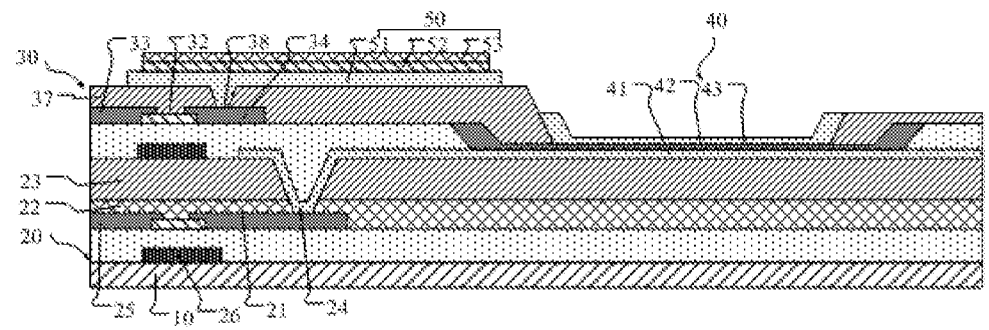

As illustrated in FIG. 4d, the second light emitting element 50 which is electrically connected with the drain 34 of the second thin film transistor is formed, and the second light emitting element 50 comprises the third electrode 51, the second light emitting layer 52 and the fourth electrode 53, herein the second light emitting element 50 is configured to emit white light. The third electrode 51 is connected with the drain 34 of the second thin film transistor; the third electrode 43 of the first light emitting element 40 is formed by a single patterning process, during the formation of the third electrode 51. The first via hole 24 is covered by a projection of the second light emitting element 50 which is orthographically projected onto the first passivation layer 23, the second via hole 38 is covered by a projection of the second light emitting element 50 which is orthographically projected onto the second passivation layer 37.

Figure 4E:
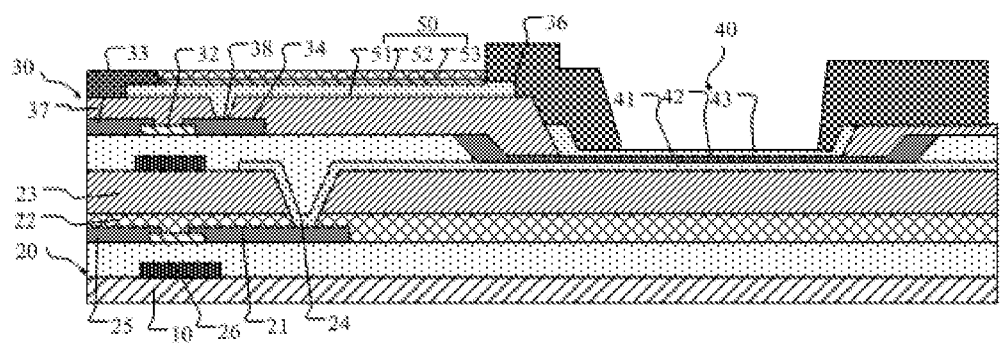

As illustrated in FIG. 4e, a pixel-defined layer 36 is formed on the second light emitting element 50 and the first light emitting element 40. One part of the third electrode 51 is covered by the pixel-defined layer 36, the other part of the third electrode 51 not covered by the pixel-defined layer 36 corresponds to the display region of the white sub-pixel.

For example, the method for manufacturing the organic electroluminescent display device provided in the present embodiment further comprises: forming a capacitor on the substrate, one electrode plate of the capacitor is disposed in the same layer as the gate or the source of the first thin film transistor, the other electrode plate of the capacitor is disposed in the same layer as the gate of the second thin film transistor; herein the capacitor is covered by a projection of the second light emitting element which is projected onto the plane in which the capacitor 60 is located.

As described above, it can be seen that an original non-display region of the organic electroluminescent display device is changed into a display region, by forming a light emitting element on the original first thin film transistor according to embodiments of the disclosure, then the aperture ratio of the display device is increased, and then the display effect of the display device is improved.

Apparently, those skilled in the art can make embodiments of the disclosure various modifications and variations, without departing from the spirit and scope of the disclosure. The disclosure further includes such modifications and variations if they fall within the scope of claims and its equivalents.

What is described above is related to the illustrative embodiments of the disclosure only and not limitative to the scope of the disclosure; the scopes of the disclosure are defined by the accompanying claims.

The present application claims the priority of Chinese patent application No. 201511032464.1 filed on Dec. 31, 2015, the disclosure of which is hereby incorporated by reference herein in its entirety.

The invention claimed is:

1. An organic electroluminescent display device, comprising:
   a substrate;

a first thin film transistor disposed on the substrate;
a second thin film transistor disposed on the first thin film transistor;
a first light emitting element electrically connected with a drain of the first thin film transistor, wherein the first light emitting element comprises a first electrode, a first light emitting layer and a second electrode which are stacked; and
a second light emitting element electrically connected with a drain of the second thin film transistor, wherein the second light emitting element is disposed on the second thin film transistor and comprises a third electrode, a second light emitting layer and a fourth electrode,
wherein the second light emitting element is configured to emit white light,
wherein the first electrode is disposed in a same layer as a gate of the second thin film transistor, and wherein the second electrode is disposed in a same layer as an active layer of the second thin film transistor.

2. The organic electroluminescent display device according to claim 1, wherein one of the first electrode and the second electrode is a reflective layer, and the other is a transflective layer, so as to form a micro-cavity structure.

3. The organic electroluminescent display device according to claim 2, wherein the micro-cavity structure further comprises a fifth electrode disposed between the first electrode and the second electrode, wherein the fifth electrode is disposed in a same layer as the third electrode.

4. The organic electroluminescent display device according to claim 1, wherein the first light emitting element comprises a red light emitting element, a green light emitting element, and a blue light emitting element; and
wherein the organic electroluminescent display device further comprises a light emitting unit, which comprises a red light emitting unit corresponding to the red light emitting element, a green light emitting unit corresponding to the green light emitting element, a blue light emitting unit corresponding to the blue light emitting element, and a white light emitting unit corresponding to the second light emitting element.

5. The organic electroluminescent display device according to claim 1, wherein the first light emitting element is a white light emitting element; and
wherein the organic electroluminescent display device further comprises a light emitting unit, which comprises a red light emitting unit comprising a first light emitting element and a red color film, a green light emitting unit comprising a first light emitting element and a green color film, a blue light emitting unit comprising a first light emitting element and a blue color film, and a white light emitting unit corresponding to the second light emitting element.

6. The organic electroluminescent display device according to claim 1, further comprising: a first passivation layer disposed between the first thin film transistor and the second thin film transistor, a first via hole disposed in the first passivation layer, wherein the first via hole is covered by a projection of the second light emitting element which is orthographically projected onto the first passivation layer.

7. The organic electroluminescent display device according to claim 1, further comprising: a second passivation layer disposed on the second thin film transistor, a second via hole disposed in the second passivation layer, wherein the third electrode is connected with the drain of the second thin film transistor through the second via hole.

8. The organic electroluminescent display device according to claim 7, wherein the second via hole is covered by a projection of the second light emitting element which is orthographically projected onto the second passivation layer.

9. The organic electroluminescent display device according to claim 1, further comprising: a capacitor disposed on the substrate, wherein the capacitor is covered by an orthographic projection of the second light emitting element onto a plane in which the capacitor is located.

10. The organic electroluminescent display device according to claim 1, wherein a light emitting direction of the first light emitting element and a light emitting direction of the second light emitting element are same as each other.

11. A method for manufacturing an organic electroluminescent display device, comprising:
providing a substrate;
forming a first thin film transistor on the substrate;
forming a second thin film transistor on the first thin film transistor;
forming a first light emitting element electrically connected with a drain of the first thin film transistor, wherein the first light emitting element comprises a first electrode, a first light emitting layer, and a second electrode which are stacked; and
forming a second light emitting element electrically connected with a drain of the second thin film transistor, wherein the second light emitting element is disposed on the second thin film transistor and comprises a third electrode, a second light emitting layer, and a fourth electrode,
wherein the second light emitting element is configured to emit white light,
wherein the first electrode and a gate of the second thin film transistor are formed by a single patterning process, and wherein the second electrode and an active layer of the second thin film transistor are formed by a single patterning process.

12. The method for manufacturing the organic electroluminescent display device according to claim 11, wherein one of the first electrode and the second electrode is a reflective layer, and the other is a transflective layer, so as to form a micro-cavity structure.

13. The method for manufacturing the organic electroluminescent display device according to claim 12, wherein the micro-cavity structure further comprises a fifth electrode, wherein the fifth electrode and the third electrode are formed by a single patterning process.

14. The method for manufacturing the organic electroluminescent display device according to claim 11, further comprising:
forming a first passivation layer between the first thin film transistor and the second thin film transistor, forming a first via hole in the first passivation layer, wherein the first via hole is covered by an orthographic projection of the second light emitting element onto the first passivation layer.

15. The method for manufacturing the organic electroluminescent display device according to claim 11, further comprising:
forming a second passivation layer on the second thin film transistor, forming a second via hole in the second passivation layer, wherein the third electrode is connected with the drain of the second thin film transistor through the second via hole.

16. The method for manufacturing the organic electroluminescent display device according to claim 15, wherein the second via hole is covered by an orthographic projection of the second light emitting element onto the second passivation layer.

17. The method for manufacturing the organic electroluminescent display device according to claim 11, further comprising: forming a capacitor, wherein one electrode plate of the capacitor is disposed in a same layer as the gate or a source of the first thin film transistor, the other electrode plate of the capacitor is disposed in a same layer as the gate of the second thin film transistor, wherein the capacitor is covered by an orthographic projection of the second light emitting element onto a plane in which the capacitor is located.

18. The method for manufacturing the organic electroluminescent display device according to claim 11, wherein a light emitting direction of the first light emitting element and a light emitting direction of the second light emitting element are same as each other.

* * * * *